(12) United States Patent
Wang et al.

(10) Patent No.: US 8,736,072 B2
(45) Date of Patent: May 27, 2014

(54) SEMICONDUCTOR DEVICE AND METHOD FOR MAKING SAME

(75) Inventors: Yu-Ching Wang, Tainan (TW);
Chan-Kang Kuo, Tainan (TW);
Ting-Yu Yen, Tainan (TW);
Hsing-Wang Chen, Tainan (TW);
Chun-Shiang Chang, Kaohsiung (TW);
Yen-Shen Chen, Taichung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 27 days.

(21) Appl. No.: 13/327,896

(22) Filed: Dec. 16, 2011

(65) Prior Publication Data
US 2013/0154114 A1   Jun. 20, 2013

(51) Int. Cl.
*H01L 29/72* (2006.01)
(52) U.S. Cl.
USPC .............. 257/775; 257/E23.175; 716/130

(58) Field of Classification Search
USPC ................ 257/775, E23.175; 716/130
See application file for complete search history.

(56) References Cited

U.S. PATENT DOCUMENTS

2010/0023287 A1* 1/2010 Worledge et al. ........... 702/65

\* cited by examiner

*Primary Examiner* — Edward Wojciechowicz
(74) *Attorney, Agent, or Firm* — Duane Morris LLP; Steven E. Koffs

(57) ABSTRACT

A semiconductor circuit pattern includes an angled conductive pattern having a line portion and a pad portion at an end of the line portion extending normal to the line portion on a first side of the line portion. The pad portion has a width greater than a width of the line portion. A spacing has a first portion adjacent the first side of the pad portion, and a second portion adjacent a second side of the pad portion opposite the first side. The first portion of the spacing has a width greater than the width of the second portion of the spacing.

13 Claims, 5 Drawing Sheets

SEMICONDUCTOR DEVICE AND METHOD FOR MAKING SAME

FIELD

This disclosure relates to semiconductor fabrication generally, and more specifically to photolithography techniques.

BACKGROUND

Semiconductor integrated circuits (ICs) are produced by a plurality of processes in a wafer fabrication facility (fab). These processes, and associated fabrication tools, may include thermal oxidation, diffusion, ion implantation, rapid thermal processing (RTP), chemical vapor deposition (CVD), physical vapor deposition (PVD), epitaxy, photolithography and etching.

In photolithography, light transfers a geometric pattern from a photo mask to a light-sensitive chemical photoresist on the substrate. The mask is created using a layout generated by an electronic design automation (EDA) tool. The EDA tool convert's a designer's gate level hardware design to a transistor level layout of geometric patterns on a plurality of layers. Each layer may be patterned by one or more masks.

At the smaller feature sizes of advanced technologies, diffraction effects become significant. The conventional diffraction-limited resolution is given by the Rayleigh criterion as 0.61λ/NA, where NA is the numerical aperture and λ is the wavelength of the illumination source. When the feature dimensions are below this size, diffraction causes rounding of corners and line-width differences between isolated pattern ("iso") and dense pattern regions. EDA tools apply optical proximity correction (OPC) to compensate for these diffraction effects. OPC may adjust the layout patterns by moving edges or adding extra polygons to the pattern written on the photomask. To keep run time at a reasonable length, OPC may be implemented using pre-computed look-up tables based on width and spacing between features.

Because of the nature of diffraction effects, a pattern in a dense region benefits less from a given OPC modification than the same pattern benefits from the same correction when located in an iso region. Thus, an EDA tool may configure dense and iso patterns on a photomask differently, in order to achieve the same line width in the final dense and iso patterns formed on the substrate.

DETAILED DESCRIPTION

Figure 2:
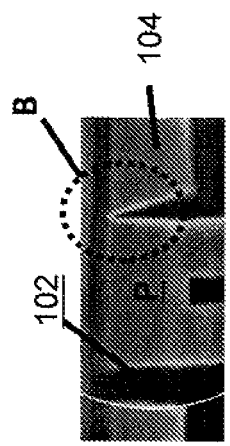
FIG. 2 is a cross section of the hockey stick pattern of FIG. 1, taken along section line 2-2 of FIG. 1.

This description of the exemplary embodiments is intended to be read in connection with the accompanying drawings, which are to be considered part of the entire written description. In the description, relative terms such as "lower," "upper," "horizontal," "vertical", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 1:
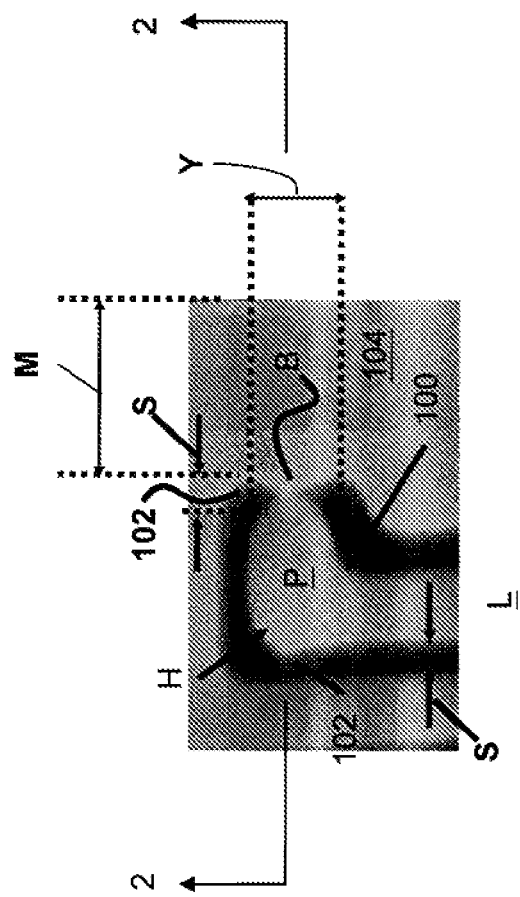
FIG. 1 is a microphotograph showing a "hockey-stick" pattern with bridging.

FIG. 1 is a microphotograph showing a "hockey-stick" structure 100 with bridging B. The hockey-stick structure 100 may be formed on any layer of an integrated circuit. For example, the hockey-stick structure 100 may be formed on a conductive line layer of a back end of line (BEOL) interconnect structure of an integrated circuit.

The hockey-stick structure 100 generally comprises an angled, L-shaped hockey-stick pattern H, and the surrounding structures 102, 104. The hockey-stick pattern H includes an elongated line portion L and a pad portion P at an end of the line portion L. The pad portion P extends normal to the line portion L on a first side of the line portion. In some embodiments, the pad portion is used as a landing for a connective via between conductive line layers. In some embodiments, the pad portion is used as a landing for a contact between an active device and a conductive line layer. In some embodiments, the pad portion P is a part of a multilayer bond pad structure. In some embodiments, the hockey stick structure is a part of a "dummy" metal structure that is not connected to any other devices. Such dummy patterns may be used, for example, for isolation, or to maintain a desired density of conductive line layer material in one of the interconnect layers.

As used herein, the terms, "first side" and "second side" are relative terms referring to any pair of opposite sides. Thus, in the embodiment of FIG. 1, the first and second sides are right and left, respectively. In some embodiments, the first and second sides are left and right, respectively. In some embodiments, the first and second sides are top and bottom, respectively. In other embodiments, the first and second sides are bottom and top, respectively. Although the pattern is shown in described with respect to one orientation, the substrate may be in any orientation. Further, a mirror image arrangement of the pattern may be used.

The pad portion P has a width WP greater than a width WL of the line portion L. The pad portion has a height Y.

A spacing 102 is arranged adjacent to and around the hockey-stick pattern H. The spacing 102 has a first (right) portion adjacent the first (right) side of the pad portion, and a second (left) portion adjacent the second (left) side of the line portion L and pad portion P, opposite the first side, The spacing 102 has a width S on the first and second sides of the pad portion P. A second conductive pattern 104 extends around the spacing 102. The second conductive pattern 104 has a first (right) portion on the first (right) side of the pad portion P. The first portion of the second conductive pattern 104 has a width M.

The inventors have discovered that in deep UV lithography, when the ratio of the height Y of pad P to the spacing width S becomes lower (e.g., less than 2.3), a metal bridge B is often formed between the pad portion P and the second conductive pattern 104. This metal bridge B causes short circuiting and reduced wafer yield.

FIG. 2 shows a side cross sectional view of the hockey-stick structure 100, with the bridge B.

The inventors have further determined that the EDA tool treats the configuration of FIG. 1 as a dense pattern, because of the relatively short distance between the two side spacing portions 102 on the first and second sides of the pad portion P, and the relatively short height Y between the portions of spacing 102 above and below the pad portion P. The inventors have further determined that the bridging can be avoided by increasing a width of the first portion 104 of the second conductive pattern in the layout, if the spacing 102 is an isolated pattern of a type that would be identified by an EDA tool as being a dense pattern. The increased width causes the EDA tool to correctly handle that pattern as an iso pattern.

Figure 3:
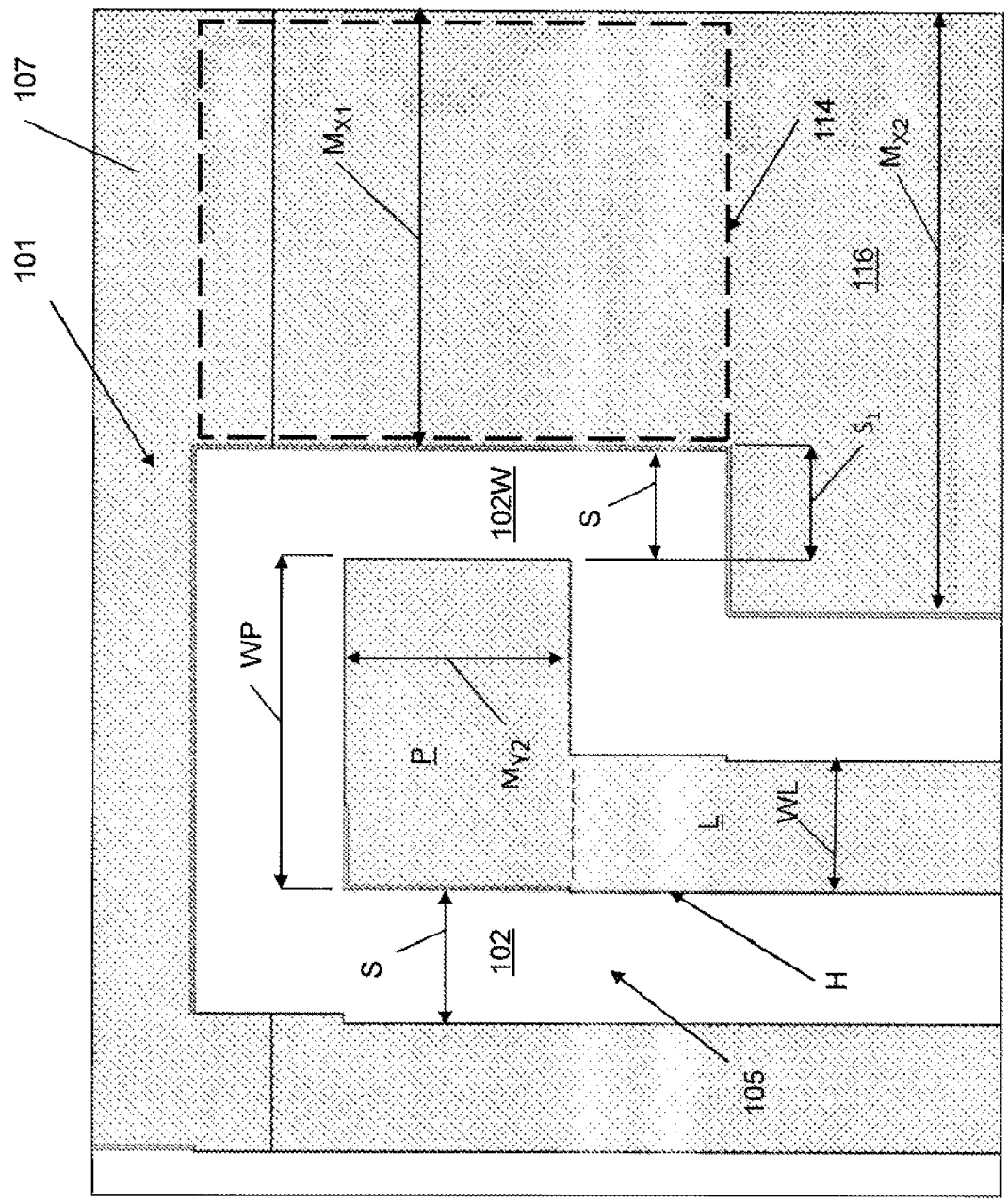
FIG. 3 is a plan view of a layout for a modified hockey-stick pattern.

FIG. 3 is a layout view of a semiconductor structure 101 with the hockey-stick pattern H.

The structure 101 includes an angled conductive pattern H having a line portion L and a pad portion P at an end of the line portion L. The pad portion P extends normal to the line portion L on a first (e.g., right) side of the line portion L. The pad portion P has a width WP greater than a width WL of the line portion.

A spacing 105 has a first portion 102W adjacent the first (e.g., right) side of the pad portion P, and a second portion 102 adjacent a second (e.g., left) side of the line portion L opposite the first side.

A second conductive pattern 107 extends around the spacing 105. The second conductive pattern 107 has a first portion 114 on the first (right) side of the pad portion P. In some embodiments, the first portion 102W of the spacing 105 is adjacent the pad portion of the conductive pattern, and the first portion 114 of the second conductive pattern 107 is adjacent the first portion 102W of the spacing. The second conductive pattern 107 has a second portion 116 on the first (e.g., right) side of the line portion L. The second portion 116 has a width $M_{X2}$ that is greater than the width $M_{X1}$ of the first portion 114 of the second conductive pattern 107.

In some embodiments, the first portion 102W of the spacing 105 has a width $S_1$ greater than the width S of the second portion 102 of the spacing 105. In one embodiment, S=0.14 μm, and $S_1$=0.146 μm. The first portion 102W of the spacing 105 has a width at least 1.04 times the width of the second portion 102 of the spacing 105. As a result of increasing the width of the first portion 102W of the spacing 105, the bridging B (FIGS. 1 and 2) is eliminated.

In some embodiments, the width of the first portion 102W of the spacing 105 is not directly input to the EDA tool. For example, the EDA tool may allow the user to specify the height $M_{Y2}$ of the pad portion P and the width $M_{X1}$ of the first portion 114 of the second conductor.

In some embodiments, the pad portion P has a height $M_{Y2}$ less than 2.3 times a width S of the second portion 102 of the spacing 105, and the first portion 114 of the second conductive pattern 107 is increased to a width greater than 3.7 times the width S of the second portion 102 of the spacing 105.

In some embodiments, the photomasks are to be used with a deep ultraviolet (DUV) laser, such as a laser emitting light having a wavelength of 248 nm. In other embodiments, light of different wavelengths (e.g., 193 nm) may be used. The pad portion P has a height $M_{Y2}$ less than 0.32 μm, and the first portion 114 of the second conductive pattern 107 is increased to a width greater than 0.52 μm. This causes the EDA tool to increase the width S1 from 0.140 μm to 0.146 μm, which is an increase of about 4% relative to the width S of the second (left) portion 102 of the spacing 105.

Figure 4:
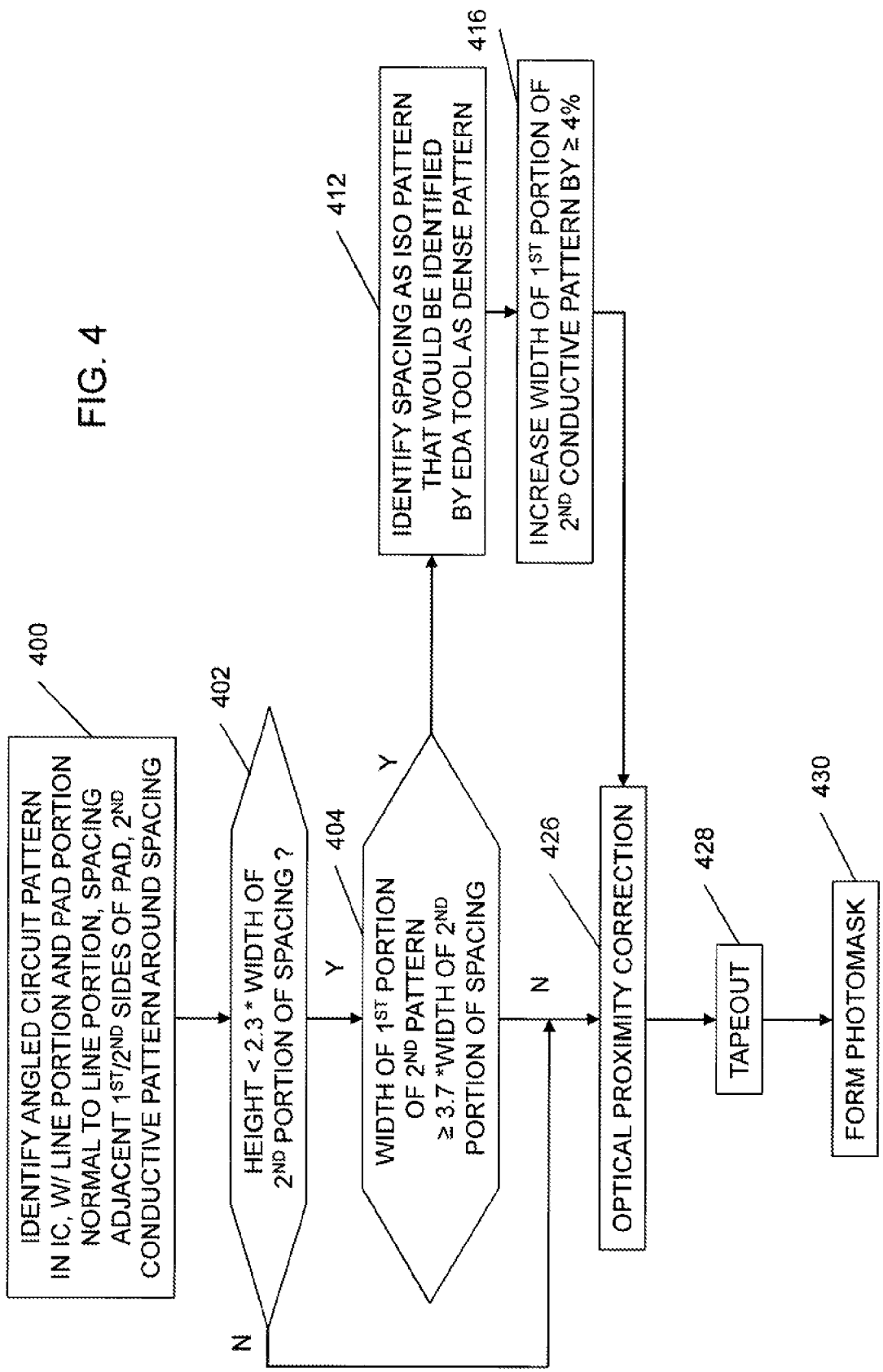
FIG. 4 is a flow chart showing an example of a method of modifying a layout of a layer of an integrated circuit.

FIG. 4 is a flow chart showing an example of a method of modifying a layout of a layer of an integrated circuit. This method may be performed after initial design rule checks are performed for an IC layout.

At step 400, an angled circuit pattern H is identified in a layout of a semiconductor integrated circuit. The pattern H has: a line portion L and a pad portion P at an end of the line portion extending normal to the line portion on a first side of the line portion. The pad portion P has a width WP greater than a width WL of the line portion L. A spacing 105 has a first portion 102W adjacent the first side of the pad portion P, and a second portion 102 adjacent a second side of the line portion L opposite the first side. A second conductive pattern 107 extends around the spacing 105. The second conductive pattern 107 has a first portion 114 on the first side of the pad portion.

At step 402, a determination is made whether the height $M_{Y2}$ of the pad portion P is less than 2.3 times a width of the second portion 102 of the spacing 105. If so, step 404 is executed next. If not, step 426 is executed next.

At step 404, a determination is made whether the width $M_{X1}$ of the first portion 114 of the second conductive pattern 107 is greater than or equal to 3.7 times the width S of the second portion 102 of the spacing 105. If so, step 412 is executed next. If not, step 426 is executed next.

At step 412, the spacing 105 is identified as an isolated pattern of the type that that would be identified by an electronic design automation tool as being a dense pattern.

At step 416, the width of the first portion of the second conductive pattern 107 is increased by at least 4%.

At step 426, optical proximity correction is performed.

At step 428, when all the layout adjustments are completed, a tapeout is performed.

At step 430, a photomask including the circuit pattern is fabricated.

Figure 5:
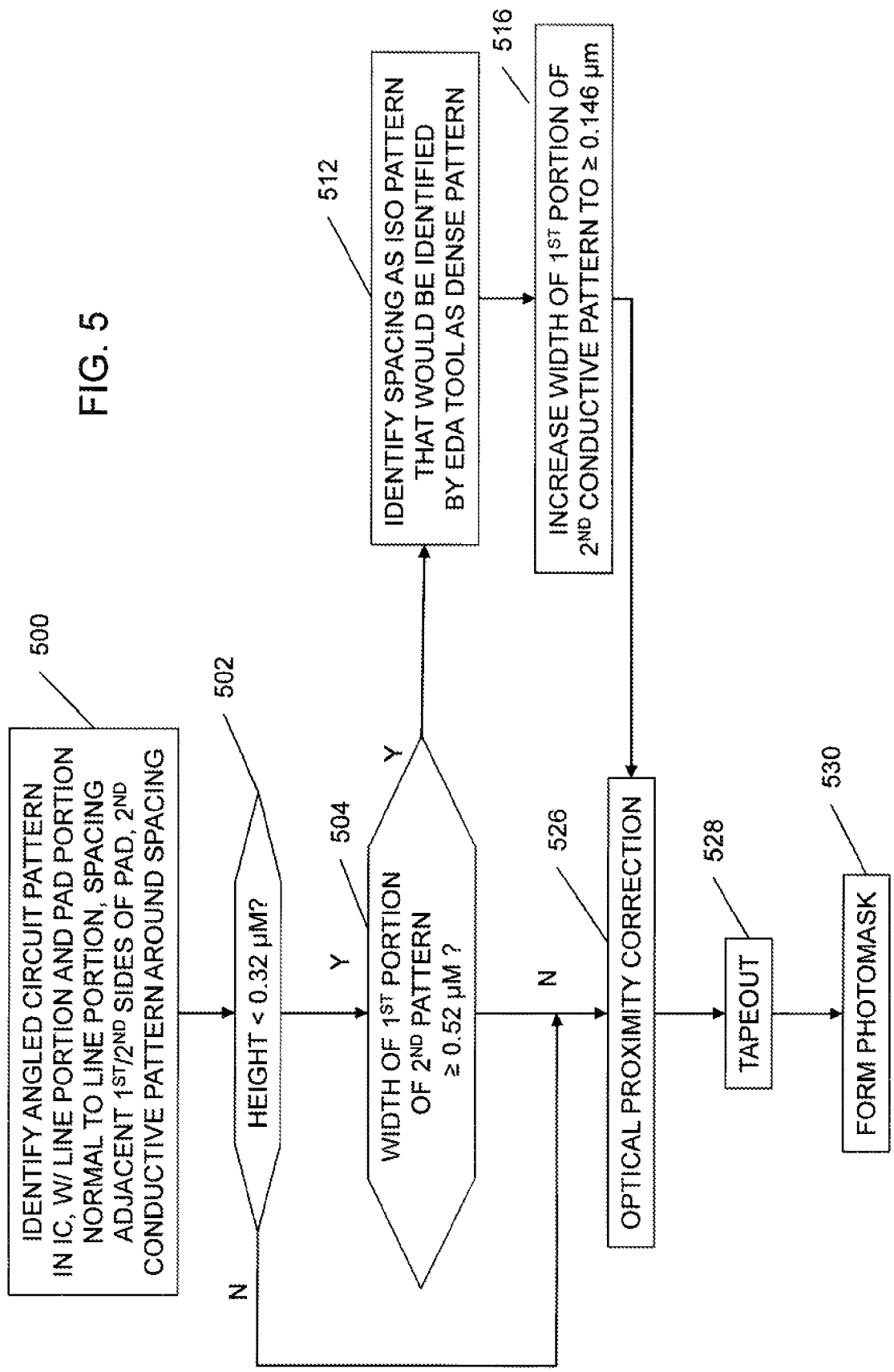
FIG. 5 is a flow chart of one example of the method.

FIG. 5 is a flow chart of one example of the method. The example of FIG. 5 may be used, for example for making a photomask to be used with a DUV laser having a wavelength of 248 nm.

At step 500, an angled circuit pattern H is identified in a layout of a semiconductor integrated circuit. The pattern H has the characteristics described above with reference to step 400 of FIG. 4, and the details are not repeated, for brevity.

At step 502, a determination is made whether the height $M_{Y2}$ of the pad portion P is less 0.32 μm. If so, step 504 is executed next. If not, step 526 is executed next.

At step 504, a determination is made whether the width $M_{X1}$ of the first portion 114 of the second conductive pattern 107 is greater than or equal to 0.52 μm. If so, step 512 is executed next. If not, step 526 is executed next.

At step 512, the spacing 105 is identified as an isolated pattern of the type that that would be identified by an electronic design automation tool as being a dense pattern.

At step 516, the width of the first portion of the second conductive pattern 107 is increased by at least 4%.

At step 526, optical proximity correction is performed.

At step 528, when all the layout adjustments are completed, a tapeout is performed.

At step 530, a photomask including the circuit pattern is fabricated.

Figure 6:
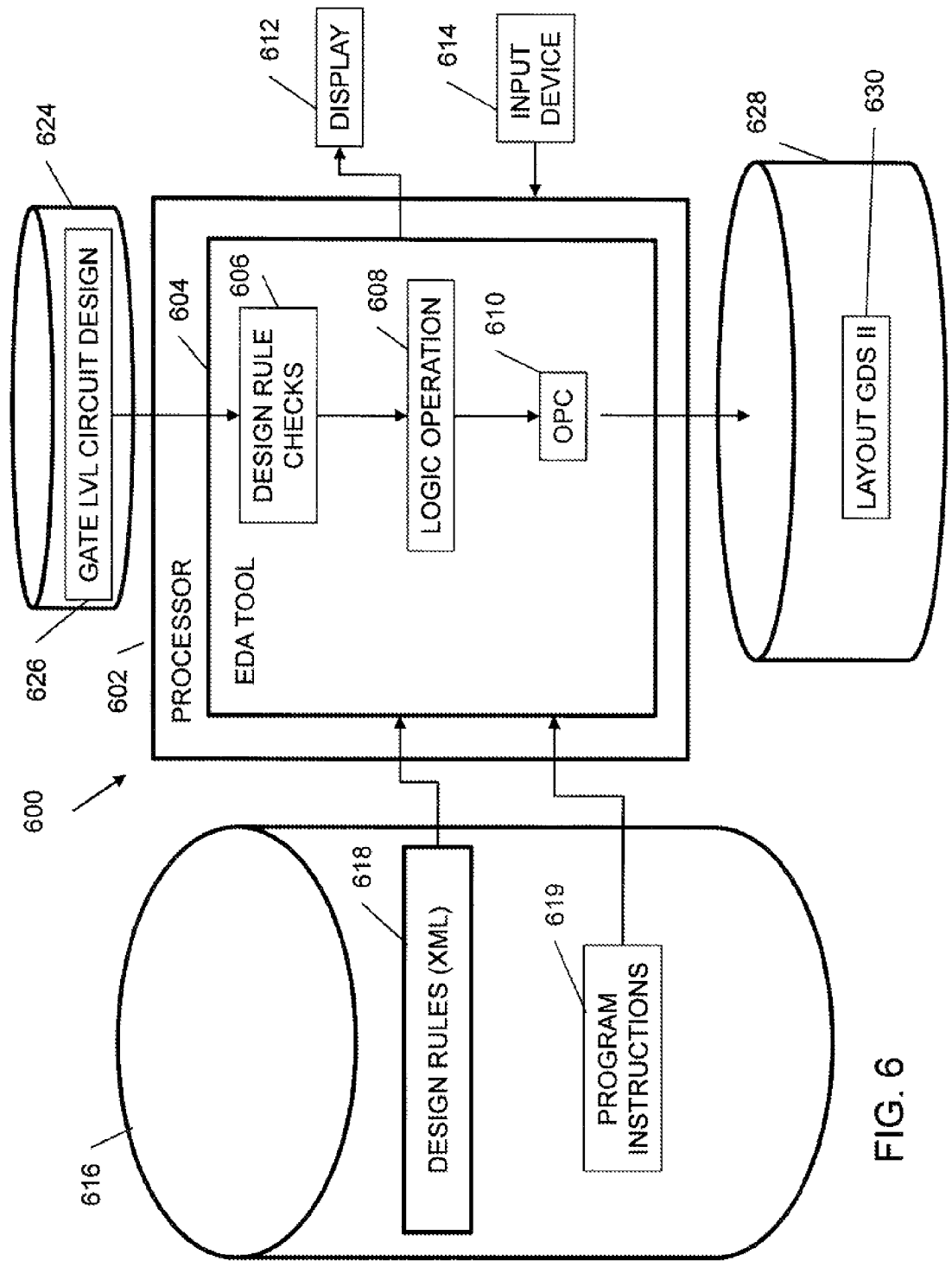
FIG. 6 is a block diagram of a system for performing the method.

FIG. 6 is a block diagram of a system for performing the method.

An EDA tool 600 is used for design and verification of an IC design, and the transformation between a gate-level description of the design and the GDS II layout (transistor level) description (or other suitable layout description format). Although FIG. 6 shows certain functions described below, FIG. 6 is not intended as a complete detailed block diagram of all of the capabilities of EDA tools. For example, the tool may include modules for developing an electronic system level (ESL) synthesis (also referred to as algorithmic synthesis, or behavioral synthesis), using ANSI C/C++/SystemC code, analyzing and architecturally constraining the ESL synthesis design to form a register transfer level (RTL) hardware design language (HDL) description, and then in turn synthesize the RTL description to the gate level description 626 which is processed by the modules 604.

The system includes at least one processor 602 which may be, for example, a general purpose computer or embedded processor configured by programming with special purpose computer program instructions 619 stored in a persistent machine readable storage medium 616. For example, an EDA tool may use a combination of the following modules: logic synthesis, behavioral synthesis, place and route, static timing analysis, formal verification, HDL (SystemC, Systemverilog/ Verilog, VHDL) simulators as well as transistor-level circuit simulation. Such systems may include a physical implementation/verification tool, e.g., IC Compiler, or ICValidator Synopsys of Mountain View, Calif., Cadence System Development Suite (e.g.,: SoC Encounter, Cadence Physical Verification System) by Cadence Design Systems, Inc. of San Jose, Calif., and"CALIBRE® INROUTE" by Mentor Graphics of Wilsonville, Oreg.

The medium 616 also includes a plurality of design rules, which include parameters that are specific to a particular technology node. The design rules typically incorporate parameters that are used for a particular foundry's implementation.

The system may include an additional machine readable medium 624 for storing the gate level circuit design 626, and an a medium 628 for storing the layout (e.g., GDS II data) 630. In some embodiments, all of the data 618, 626 and 630 may be stored on the same medium.

The EDA tool includes a module 606 for performing design rule checks, a module for performing a logic operation 608 as described above with reference to FIG. 4 or FIG. 5, and an OPC module 610 for performing OPC after the adjustment of the spacing dimension.

In some embodiments, a semiconductor circuit pattern comprises an angled conductive pattern having a line portion and a pad portion at an end of the line portion extending normal to the line portion on a first side of the line portion. The pad portion has a width greater than a width of the line portion. A spacing has a first portion adjacent the first side of the pad portion, and a second portion adjacent a second side of the pad portion opposite the first side. The first portion of the spacing has a width greater than the width of the second portion of the spacing.

In some embodiments, a semiconductor circuit pattern comprises an angled conductive pattern having a line portion and a pad portion at an end of the line portion extending normal to the line portion on a first side of the line portion. The pad portion has a width greater than a width of the line portion. A spacing has a first portion adjacent the first side of the pad portion, and a second portion adjacent a second side of the pad portion opposite the first side. A second conductive pattern extends around the spacing. The second conductive pattern has a first portion on the first side of the pad portion. The pad portion has a height less than 2.3 times a width of the second portion of the spacing, and the first portion of the second conductive pattern has a width greater than 3.7 times the width of the second portion of the spacing.

In some embodiments, a method comprises: identifying an angled circuit pattern in a layout of a semiconductor integrated circuit, the pattern having: a line portion and a pad portion at an end of the line portion extending normal to the line portion on a first side of the line portion, the pad portion having a width greater than a width of the line portion, a spacing having a first portion adjacent the first side of the pad portion, and a second portion adjacent a second side of the pad portion opposite the first side, and a second conductive pattern extending around the spacing, the second conductive pattern having a first portion on the first side of the pad portion. A width of the first portion of the second conductive pattern in the layout is increased if the spacing is an isolated pattern of a type that would be identified by an electronic design automation tool as being a dense pattern.

The methods and system described herein may be at least partially embodied in the form of computer-implemented processes and apparatus for practicing those processes. The disclosed methods may also be at least partially embodied in the form of tangible, non-transient machine readable storage media encoded with computer program code 119. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that the computer becomes a special purpose apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A semiconductor circuit pattern, comprising:
   an L-shaped conductive pattern having a line portion and a pad portion at an end of the line portion, the pad portion extending on a first side of the line portion in a first direction normal to a length of the line portion, the pad portion having a width in the first direction which is greater than a width of the line portion; and
   a second conductive pattern having an L-shaped opening around the L-shaped conductive pattern, defining a spacing between the L-shaped conductive pattern and the second conductive pattern, the spacing having a first portion adjacent the first side of the pad portion, and a second portion adjacent a second side of the pad portion, the second side opposite the first side,
   wherein the first portion of the spacing has a width greater than the width of the second portion of the spacing.

2. The semiconductor circuit pattern of claim 1, wherein the first portion of the spacing has a width at least 1.04 times the width of the second portion of the spacing.

3. The semiconductor circuit pattern of claim 1, wherein the second conductive pattern has a first portion on the first side of the pad portion, and
   wherein the pad portion has a height less than 2.3 times a width of the second portion of the spacing, and the first portion of the second conductive pattern has a width greater than 3.7 times the width of the second portion of the spacing.

4. The semiconductor circuit pattern of claim 3, wherein the pad portion has a height less than 0.32 µm, and the first portion of the second conductive pattern has a width greater than 0.52 µm.

5. The semiconductor circuit pattern of claim 4, wherein the first portion of the spacing has a width at least 0.146 µm.

6. The semiconductor circuit pattern of claim 1, wherein the second conductive pattern has a second portion on the first side of the line portion, adjacent the line portion, the second portion having a width that is greater than the width of the first portion of the second conductive pattern.

7. The semiconductor circuit pattern of claim 6, wherein the first portion of the spacing is adjacent the pad portion of the conductive pattern, and the first portion of the second conductive pattern is adjacent the first portion of the spacing.

8. A semiconductor circuit pattern, comprising:
   an L-shaped conductive pattern having a line portion and a pad portion at an end of the line portion, the pad portion extending normal to the line portion on a first side of the line portion, the pad portion having a width greater than a width of the line portion; and
   a second conductive pattern having an L-shaped opening around the L-shaped conductive pattern, defining a spacing extending around the L-shaped conductive pattern, between the L-shaped conductive pattern and the second conductive pattern, the second conductive pattern having a first portion on the first side of the pad portion,
   the spacing having a first portion adjacent the first side of the pad portion, and a second portion adjacent the second side of the pad portion, the first portion of the spacing having a width greater than the width of the second portion of the spacing,
   wherein the pad portion has a height in a plane of the pad portion less than 2.3 times a width of the second portion of the spacing, where the height is measured from a bottom of the pad portion abutting the end of the line to a top of the pad portion distal from the end of the line, and the first portion of the second conductive pattern has a width greater than 3.7 times the width of the second portion of the spacing, the width of the first portion of the second conductive pattern being measured in a direction extending away from the pad portion.

9. The semiconductor circuit pattern of claim 8, wherein the first portion of the spacing has a width at least 1.04 times the width of the second portion of the spacing.

10. The semiconductor circuit pattern of claim 8, wherein the first portion of the spacing is adjacent the pad portion of the conductive pattern, and the first portion of the second conductive pattern is adjacent the first portion of the spacing.

11. The semiconductor circuit pattern of claim 10, wherein the second conductive pattern has a second portion on the first side of the line portion, adjacent the line portion, the second portion of the second conductive pattern having a width that is greater than the width of the first portion of the second conductive pattern.

12. The semiconductor circuit pattern of claim 8, wherein the pad portion has a height less than 0.32 μm, and the first portion of the second conductive pattern has a width greater than 0.52 μm.

13. The semiconductor circuit pattern of claim 8, wherein the first portion of the spacing has a width at least 0.146 μm.

* * * * *